United States Patent [19]

Ferrier

[11] Patent Number: 5,334,240

[45] Date of Patent: Aug. 2, 1994

[54] AQUEOUS ACIDIC TIN-LEAD IMMERSION PLATING BATH CONTAINING WEAK ACID AND WEAK BASE

[75] Inventor: Donald R. Ferrier, Thomaston, Conn.

[73] Assignee: MacDermid, Incorporated, Waterbury, Conn.

[21] Appl. No.: 532,372

[22] Filed: Jun. 4, 1990

[51] Int. Cl.$^5$ .................. C23C 18/16; C23C 18/52; C23C 18/54

[52] U.S. Cl. .................. 106/1.22; 427/433; 427/437; 427/97; 427/98; 205/85

[58] Field of Search .................. 106/1.22; 204/44.4, 204/DIG. 2; 427/437, 433, 98, 87

[56] References Cited

FOREIGN PATENT DOCUMENTS

| 180265 | 5/1986 | European Pat. Off. . |
| 3800918 | 7/1989 | Fed. Rep. of Germany . |
| 49-064527 | 6/1974 | Japan . |
| 550015741 | 2/1975 | Japan . |

Primary Examiner—Mark L. Bell
Assistant Examiner—Scott L. Hertzog
Attorney, Agent, or Firm—St. Onge Stewart Johnston & Reens

[57] ABSTRACT

Immersion tin-lead baths are provided, preferably free of hypophosphite ion, comprising a strongly acidic aqueous solution comprised of thiourea, water-soluble sources of divalent tin and lead, a weak acid, and a weak base.

10 Claims, No Drawings

AQUEOUS ACIDIC TIN-LEAD IMMERSION PLATING BATH CONTAINING WEAK ACID AND WEAK BASE

BACKGROUND OF THE INVENTION

The present invention relates to the general field of metal finishing, more particularly to the provision of tin-lead coatings on metallic substrates such as copper, and still more particularly to aqueous acidic tin-lead immersion baths.

It has long been known that tin and lead can be co-deposited in non-electrolytic manner over metallic substrate surfaces such as copper by means of chemical exchange/replacement reaction using aqueous acidic solutions (baths) containing tin and lead salts. Such processes can find use in many metal finishing applications, and are in principle particularly suitable in sequences for the fabrication of printed circuits wherein tin-lead is used as an etch resist for predetermined areas of copper circuitry and/or wherein tin-lead is applied over selected copper areas (e.g., through-holes, surrounding pads, etc.) and later reflowed to provide a solder layer for preserving and/or enhancing the solderability of those areas.

Tin-lead immersion baths contain, as noted, sources of divalent tin and lead ions in the form of water-soluble tin and lead salts, and are strongly acidic, either by use of particular tin and/or lead salts (e.g., fluoborates) and/or by provision of acids or acid-engendering materials separate and apart from the tin and lead salts. Another essential component of tin-lead immersion baths is thiourea, serving the function as a complexing agent for the tin and lead ions in the bath. All known commercial tin-lead immersion baths also contain hypophosphite ion, e.g., hypophosphorous acid and/or alkali metal salts thereof, typically sodium hypophosphite, as an essential component for stabilizing the bath and providing denser, more uniform deposits.

Efforts to eliminate hypophosphite from tin-lead immersion baths have not proven successful in the art. In particular, elimination of hypophosphite from tin-lead immersion baths tends to result in deposits having a high tin concentration irrespective of the balance between tin and lead ions in the bath. This is problematic in situations where the bath is used to provide a tin-lead layer which is to be reflowed to produce a solder layer, since it is difficult, if not impossible, to obtain a layer whose concentrations of tin and lead are such as to provide the desired solder composition (i.e., most preferably at or near the 63% tin/37% lead eutectic) upon reflow. As a result, resort must be had to other soldering techniques, such as hot air solder levelling and the like, to achieve the desired aim of preserving and/or enhancing solderability of those areas.

SUMMARY OF THE INVENTION

It is the primary object of the present invention to provide a tin-lead immersion bath capable of depositing tin-lead layers of desired composition.

Another object of the invention is to provide a stable tin-lead immersion bath meeting the foregoing objective.

Yet another object of the invention is to provide a stable, hypophosphite-free, tin-lead immersion bath.

Still another object of the invention is to provide a process for depositing a tin-lead layer of desired composition on a metallic substrate, particularly a copper substrate.

These and other objects are attained by the provision according to the invention of an aqueous acidic solution containing thiourea, a water-soluble source of divalent tin ion, a water-soluble source of divalent lead ion, at least one weak acid, and at least one weak base. Surprisingly, it has been found that solutions of this type function as stable tin-lead immersion baths even in the absence of any hypophosphite, and can be employed to deposit tin-lead layers of any desired tin-lead ratio, including ratios at or near the solder eutectic.

In the most preferred form of the invention, the tin-lead immersion bath will be entirely free of hypophosphite ion, while in less preferred embodiments hypophosphite ion can be present if desired.

In the process of the invention, metallic substrates, particularly copper substrates, are provided with a tin-lead layer of desired composition by immersion of the substrate in the bath of the invention, typically at elevated temperature on the order of about 170° F., for a time sufficient to bring about deposition of a layer of tin-lead on the metallic surface.

DETAILED DESCRIPTION OF THE INVENTION

The invention has applicability to the provision of tin-lead coatings on any metallic surface capable of undergoing chemical exchange/replacement reaction with the tin and lead ions of the immersion bath, but finds its primary applicability in the provision of tin-lead coatings on surfaces of copper (or copper alloys), particularly in the context of fabrication of printed circuits having conductive copper circuitry.

The fundamental and essential components of the tin-lead immersion bath of the invention are water; thiourea; water-soluble sources (e.g., salts) of divalent tin and lead ions; at least one weak acid; and at least one weak base.

Also essential to the bath is that it be relatively strongly acidic. The requisite strong acidity can be achieved entirely or partly by virtue of the aforementioned essential components of the composition, such as by use of particular sources of tin and lead in the bath (e.g., tin and lead fluoborates, which are sources of free fluoboric acid), or alternatively can be achieved by resort to acids or acid-engendering materials independent of the other essential bath components, so long as those overtly added materials do not interfere with the essential functionality of the bath. For example, hydrochloric acid is not a favored source of acidity since chloride ion tends to increase the concentration of tin in the tin-lead deposit. As a consequence, acid per se is not recited herein as an essential bath component; rather, reference is made more generically to the bath being strongly acidic, irrespective of how that criterion is met.

Generally speaking, the tin-lead immersion bath will have a pH of about 3 or less, and more preferably a pH of about 2 or less. As is known in the art, the measurement of pH in solutions containing materials such as fluoborates can be problematic, so for solutions of this type the pH criterion, at least as a measurable value, is to a degree capable of some imprecision.

The water-soluble sources of divalent tin and lead can be chosen from any suitable, available sources, and, as has been noted, the fluoborate salts are preferred for use in the invention.

The concentrations of divalent tin and lead in the bath are chosen based upon the amount/thickness of tin-lead coating desired to be deposited on the metallic substrate in the immersion process, and the area to be coated, recognizing that the immersion bath is not autocatalytic and can only deposit tin-lead to the extent metallic substrate is available for dissolution in the chemical replacement/exchange reaction and to the extent tin and lead ions are present in the bath for participation in that reaction.

So too, of course, the relative concentrations of divalent tin and lead in the immersion bath are chosen depending upon the weight ratio of tin and lead ultimately desired in the tin-lead deposit. As previously noted, an important advantage of the baths of this invention is that they can be formulated to deposit tin-lead coatings of any desired tin/lead weight ratio in at least approximate correlation to the tin and lead ion ratio in the bath. In contrast, other attempts at formulating tin-lead immersion baths free of hypophosphite are typically plagued by production of high tin content deposits, largely irrespective of the relative ratio of tin and lead ions in the bath.

Accordingly, divalent tin typically will be present in the bath at concentrations of anywhere from 15 g/l to about 20 g/l, while lead ions are present in concentrations of from 5 g/l to about 10 g/l. For most practical applications, i.e., the attainment of tin-lead coatings having a tin-lead weight ratio at or near the solder eutectic, tin ion will be present in the bath at a concentration of from about 16 g/l to about 18 g/l; lead ion will be present at a concentration of from about 6 g/l to about 8 g/l; and the ratio of tin to lead ions in the bath will be from about 3:1 to about 2:1.

The concentration of thiourea in the fresh tin-lead immersion bath will be largely dependent upon the concentrations therein of tin and lead ions, and typically will be from about 70 g/l to about 100 g/l, most preferably from about 80 g/l to about 90 g/l.

In further accordance with the invention, the tin-lead immersion bath contains at least one weak acid and at least one weak base. As used herein, a weak acid is defined as an acid which is not fully dissociated in aqueous solution, and more particularly and preferably having a dissociation constant in aqueous solution ($pK_a$; 25° C.) in the range of about 2 to 6 (first hydrogen where applicable). The weak acid may be organic or inorganic, and preferred weak acids are the organic acids such as citric ($pK_a=3.14$, first hydrogen), acetic ($pK_a=4.75$), tartaric acid ($pK_a=2.98$, first hydrogen), and the like. Weak bases herein are those having a dissociation constant in aqueous solution ($PK_b$; 25° C.) in the range of about 2 to 6. The weak base may be organic or inorganic, and preferably is a weak base such as an aqueous ammonia solution or a water-soluble organic amine whose salts are also water-soluble, such as hydrazine, ethylamine, diethylamine, triethanolamine, and the like. For both the weak acid and weak base, salts thereof also can be employed as sources of the acid and/or base.

Generally, the weak acid and weak base are employed at relatively low concentrations in the bath, with the concentrations per se depending, of course, on the particular weak acid and weak base employed, and the concentrations of other components in the bath. The ultimate criterion is a functional one, i.e., the acid and base will be chosen, and employed at levels, effective to maintain the stability of the bath in the absence of hypophosphite and to enable the bath to deposit tin-lead in weight ratios correlatable to the weight ratio of tin and lead ions in the bath, and particularly enabling deposit of tin-lead having a tin-lead weight ratio at or near the solder eutectic. For the preferred citric, acetic or tartaric acids, their concentration in the bath will typically be in the range of from about 5 to about 20 g/l, while for the preferred weak base ammonia solutions, there generally will be provided in the bath from about 1 g/l to about 10 g/l (29% aqueous ammonia basis). It is theorized that the weak acid and weak base bring about a buffering action which controls the pH of the bath and enables the bath to be stable and to be capable of co-deposition of tin and lead in desired weight ratios.

As noted, the preferred embodiment of the invention contemplates a hypophosphite-free bath, but advantages are still found even if hypophosphite is included in the bath.

For use of the tin-lead immersion bath of the invention, the metallic (e.g., copper) surfaces to be provided with tin-lead are typically treated prior to immersion in order to prepare the surfaces for receipt of the tin-lead immersion deposit. Such pretreatments are well known in the art, and include steps such as microetching and immersion in pre-dip solutions (e.g., fluoboric acid/boric acid). Thereafter, the metallic surfaces are immersed in the tin-lead bath, preferably at a bath temperature of from about 160° F. to about 180° F., and most preferably on the order of about 170° F., for the time necessary to produce the tin-lead deposit. A typical immersion time is from about 10 to 20 minutes.

The bath can be used to treat a number of substrates at the same time and/or serially, and the bath components can be replenished as required.

The invention is further illustrated with reference to the following examples.

EXAMPLE I

A hypophosphite-free tin-lead immersion bath was made up according to the following:

| | |
|---|---|
| Thiourea | 42.3 g |
| Boric Acid | 3.0 g |
| Citric Acid | 11.0 g |
| Aqueous Ammonia (29%) | 3.5 g |
| Lead Fluoborate Soln. (51%) | 11.7 g |
| Tin Fluoborate Soln. (51%) | 46.6 g |
| Water | To 500 ml. |

A copper-clad laminate rate panel was microetched (Metex G-4 Micro-Etch, MacDermid, Inc., Waterbury, Conn.), rinsed, immersed in a room temperature aqueous pre-dip containing 2% by volume fluoboric acid (48%) and 6 g/l boric acid, and then immersed in the tin-lead bath (170° F.) for 10 minutes. An immersion tin-lead deposit having an average thickness of 0.23 mils (5.8 microns), and a tin concentration of 69% by weight, was produced.

EXAMPLE II

For comparison with Example I, the identical procedure was followed, but the immersion tin-lead bath had the following composition:

| | |
|---|---|
| Thiourea | 42.3 g |
| Boric Acid | 3.0 g |
| Citric Acid | 10.0 g |
| Lead Fluoborate Soln. (51%) | 11.7 g |
| Tin Fluoborate Soln. (51%) | 46.6 g |

-continued

| | |
|---|---|
| Water | To 500 ml. |

The immersion tin-lead deposit had an average thickness of only 0.14 mils (3.5 microns) and a tin concentration of 90% by weight.

EXAMPLE III

The procedure of Example I was followed, with the exception that the tin-lead immersion bath had a composition as follows:

| | |
|---|---|
| Thiourea | 42.3 g |
| Boric Acid | 3.0 g |
| DL Tartaric Acid | 10.0 g |
| Aqueous Ammonia (29%) | 3.5 g |
| Lead Fluoborate Soln. (51%) | 11.7 g |
| Tin Fluoborate Soln. (51%) | 46.6 g |
| Water | To 500 ml. |

The immersion tin-lead deposit had an average thickness of 0.23 mils (5-8 microns) and a tin content of 64% by weight.

EXAMPLE IV

The procedure of Example I was followed, with the exception that the tin-lead immersion bath had a composition as follows:

| | |
|---|---|
| Thiourea | 42.3 g |
| Glacial Acetic Acid | 10.6 g |
| Aqueous Ammonia (29%) | 4.5 g |
| Boric Acid | 3.0 g |
| Lead Fluoborate Soln. (51%) | 11.7 g |
| Tin Fluoborate Soln. (51%) | 46.6 g |
| Water | To 500 ml. |

The immersion tin-lead deposit had an average thickness of 0.23 mils (5.8 microns) and a tin content of 58% by weight. After running several additional panels in the bath and replenishing tin, lead and thiourea, immersion tin-lead deposits having an average thickness of 0.28 mils (7 microns) and a tin content of 66% by weight were obtained.

EXAMPLE V

The procedure of Example I was followed, with the exception that the tin-lead immersion bath had a composition as follows:

| | |
|---|---|
| Thiourea | 42.3 g |
| Glacial Acetic Acid | 13.8 g |
| Triethanolamine | 10.7 g |
| Boric Acid | 3.0 g |
| Lead Fluoborate Soln. (51%) | 11.7 g |
| Tin Fluoborate Soln. (51%) | 43.0 g |
| Water | To 500 ml. |

The immersion tin-lead deposit had an average thickness of 0.26 mils (6.5 microns) and a tin content of 75% by weight.

EXAMPLE VI

The procedure of Example I was followed, with the exception that the tin-lead immersion bath had a composition as follows:

| | |
|---|---|
| Thiourea | 42.3 g |
| Glacial Acetic Acid | 13.8 g |
| Triethanolamine | 10.7 g |
| Boric Acid | 3.0 g |
| Lead Fluoborate Soln. (51%) | 11.7 g |
| Tin Fluoborate Soln. (51%) | 43.0 g |
| Water | To 500 ml. |

The immersion tin-lead deposit (obtained in 20 minutes) had an average thickness of 0.25 mils (6.25 microns) and a tin content of 62% by weight.

The foregoing description and examples are provided in illustration of the invention and its preferred embodiments, and are not intended as limitations on the scope of the invention except as set forth in the appended claims.

What is claimed is:

1. An aqueous strongly acidic tin-lead immersion plating bath comprising thiourea, a water-soluble source of divalent tin ion, a water-soluble source of divalent lead ion, a weak acid selected from the group consisting of citric acid, acetic acid, tartaric acid and mixtures thereof, and aqueous ammonia.

2. An aqueous, strongly acidic, hypophosphite-free tin-lead immersion plating bath, comprising thiourea, a water-soluble source of divalent tin ion, a water-soluble source of divalent lead ion, a weak acid selected from the group consisting of citric acid, acetic acid, tartaric acid and mixtures thereof, and aqueous ammonia.

3. A bath according to claim 2 wherein said water-soluble source of divalent tin ion is tin fluoborate and wherein said water-soluble source of divalent lead ion is lead fluoborate.

4. A bath according to claim 2 further comprising boric acid.

5. An aqueous, strongly acidic, hypophosphite-free tin-lead immersion bath, comprising thiourea; tin fluoborate; lead fluoborate; boric acid; a weak acid selected from the group consisting of citric acid, acetic acid, tartaric acid, and mixtures thereof; and aqueous ammonia.

6. A bath according to claim 5 wherein the relative ratio of said tin fluoborate to said lead fluoborate is effective to produce an immersion tin-lead deposit having a tin content of from about 50 to 70% by weight.

7. A bath according to claim 6 wherein said tin content in said tin-lead deposit is from about 60 to 70% by weight.

8. An aqueous, strongly acidic tin-lead immersion plating bath comprising thiourea, boric acid, a water-soluble source of divalent tin ion, a water-soluble source of divalent lead ion, a weak acid and aqueous ammonia.

9. A bath according to claim 8 which is hypophosphite-free.

10. A process for providing a tin-lead layer on a metallic substrate surface, comprising immersing said substrate surface in contact with a plating bath according to any of claims 1, 2, 3, 4, 5, 6, 7, 8 or 9 for a time and at conditions effective to deposit a layer of tin-lead on said substrate surface.

* * * * *